United States Patent [19]
Akiyama et al.

[11] Patent Number: 5,534,821
[45] Date of Patent: Jul. 9, 1996

[54] CHARGE PUMP CIRCUITS FOR PLL FREQUENCY SYNTHESIZER

[75] Inventors: Takehiro Akiyama; Katsuya Shimomura; Kouzi Takekawa; Takehito Doi, all of Kasugai, Japan

[73] Assignee: Fujitsu Limited, Kawasaki, Japan

[21] Appl. No.: 288,924

[22] Filed: Aug. 11, 1994

[30] Foreign Application Priority Data

Sep. 20, 1993 [JP] Japan ................................. 5-233559
Jan. 14, 1994 [JP] Japan ................................. 6-002856

[51] Int. Cl.⁶ .................................................. H03L 7/093
[52] U.S. Cl. .................................. 331/8; 331/14; 331/17; 331/25; 327/157
[58] Field of Search .............................. 331/8, 17, 14, 331/25; 327/108, 109, 148, 157

[56] References Cited

U.S. PATENT DOCUMENTS

| | | | |
|---|---|---|---|
| 3,009,070 | 11/1961 | Barnes | 307/88.5 |
| 4,792,705 | 12/1988 | Ouyang et al. | 331/8 |
| 4,926,141 | 5/1990 | Herold et al. | 331/1 A |
| 4,970,472 | 11/1990 | Kennedy et al. | 331/8 |
| 5,003,198 | 3/1991 | Bell | 307/315 |
| 5,124,594 | 6/1992 | Numata et al. | 307/528 |

FOREIGN PATENT DOCUMENTS

| | | |
|---|---|---|
| 0080732 | 6/1983 | European Pat. Off. . |
| 0493251 | 7/1992 | European Pat. Off. . |
| 2850653 | 11/1978 | Germany . |
| 3813550 | 3/1989 | Germany . |
| 58-194433 | 11/1983 | Japan . |

*Primary Examiner*—Siegfried H. Grimm
*Attorney, Agent, or Firm*—Armstrong, Westerman, Hattori, McLeland & Naughton

[57] ABSTRACT

A PLL frequency synthesizer, which comprises a voltage controlled oscillator, and a comparison frequency divider for dividing a frequency of the output signal from the voltage controlled oscillator to output a comparison signal. A phase comparator in the synthesizer compares a phase of a reference signal to be fed thereto with a phase of the comparison signal, and generates first and second phase difference signals, based on the compared result. The synthesizer further includes a charge-pump circuit operated based on the first and second phase difference signals, and having an output terminal connected to the voltage controlled oscillator. The charge-pump circuit includes a first bipolar transistor connected between a high-potential power supply and the output terminal, and a second bipolar transistor connected between a low-potential power supply and the output terminal. The first and second bipolar transistors are controlled based on the first and second phase difference signals, respectively. At least one of the first and second bipolar transistors is an emitter-follower type. In another embodiment, a node is provided between two switches formed by CMOS transistors, to serve as an output terminal of the charge-pump circuit. In a further embodiment, two PMOS transistors are provided as switches, and a node is provided therebetween to serve as an output terminal of the charge-pump circuit.

6 Claims, 5 Drawing Sheets

CHARGE PUMP CIRCUITS FOR PLL FREQUENCY SYNTHESIZER

BACKGROUND OF THE INVENTION

1. Field of the Invention

The present invention relates to a Phase Locked Loop (PLL) frequency synthesizer circuit which operates to maintain the frequency of the synthesizer's output signal at a desired frequency value pre-set by a user, and more particularly to a charge-pump circuit which is one of the components of the PLL synthesizing circuit.

2. Description of the Related Art

Recently, PLL frequency synthesizer circuits have found widespread application in such mobile communication devices such as the cellular or cordless phones. The number of these devices used by the public has increased dramatically due to their widespread popularity with the public. With an increased number of the users, it has become necessary to reduce the area of the phone's effective operation and/or to execute a time-division process that ensures the effective time-based usage of a particular frequency used with a particular signal. Digital signal processing has, in response to these constraints, made significant inroads in the technological advancement of mobile communication devices. With the increased use of digital movable communication devices, there is an also a demand to increase the tuning speed of PLL frequency synthesizer circuits. To effect this increase in the tuning speed of the PLL frequency synthesizer, therefore, various techniques have been proposed, the most important of which has been to enhance the characteristics of the charge pump circuit used in the mobile communication device.

FIG. 1 shows a conventional PLL frequency synthesizer circuit 100. The synthesizer circuit 100 is composed of a reference counter 111, a crystal oscillator 112, a comparative frequency divider 113, a phase comparator 117, a charge-pump circuit 118, a low-pass filter (simply referred to as LPF) 119, and a voltage controlled oscillator (simply referred to as VCO) 120. The LPF 119 is composed of an integrating circuit having two resistors R15, R16 and a capacitor C2.

The reference counter 111 operates to divide the frequency of an oscillation signal FOSC, output from the crystal oscillator 112 at a predetermined frequency in order to generate a reference signal FR at a reference frequency. The reference signal FR is output to the phase comparator 117.

The comparative frequency divider 113 includes a prescaler 114, a program counter 115, and a swallow counter 116 for switching a dividing ratio of the prescaler 114. The prescaler 114 divides a frequency of the signal FVCO output from the VCO 120 to generate a frequency-divided signal S1. If the frequency-dividing ratio is expressed by "M", the prescaler 114 normally divides a frequency of the output signal FVCO by a factor of (M+1). Based on a switching signal MC output from the swallow counter 116, the prescaler 114 divides the frequency of the output signal FVCO by a factor of M.

The program counter 115 divides a frequency of the dividing signal S1 to generate a comparison signal FP. The program counter 115 may set the frequency of the comparison signal FP to any value, and divide a frequency of the signal S1 to form a desired frequency. If the frequency-dividing ratio is expressed by "α", the swallow counter 116 divides a frequency of the signal S1 into a factor of α. when the frequency-dividing is completed, the swallow counter 116 operates to output a switching signal MC to the prescaler 114.

The phase comparator 117 compares a phase of the reference signal FR with that of the comparison signal FP, and outputs pulsewise phase difference signals φR and φP to the charge-pump circuit 118, based on the phase difference between the signals FR and FP. When the phase difference signal φR is low, the phase difference signal φP is maintained low. When the phase difference signal φP is high, the phase difference signal φR is maintained high.

The charge-pump circuit 118 is provided with a PNP transistor T11, an NPN transistor T12, and four resistors R11 to R14. Each of the transistors T11 and T12 is a bipolar transistor with a grounded emitter. The transistor T11 has its emitter coupled to the power supply Vcc, its collector connected to the LPF 119, and its base connected to the phase comparator 117 via the resistor R12. The base serves to receive the phase difference signal φR and is connected to the power supply VCC via the resistor R11. The transistor T12 has an emitter connected to the ground GND, a collector connected to the LPF 119, a base connected to the phase comparator 117 via the resistor R14. The base serves to receive the phase difference signal φP and is connected to the ground GND via the resistor R13.

When the phase difference signals φR and φP are both maintained at low voltage levels, only the transistor T11 remains on, effectively allowing transistor T11 to control the output of voltage signal DO from transistor T11 to the LPF 119. When the phase difference signals φR and φP are both held at the H level, only the transistor T12 remains on, effectively allowing transistor T12 to control the output of voltage signal DO to the LPF 119. Based on the level of the phase difference signals φR and φP, either the transistors T11 or T12 will be on to change the voltage level of the voltage signal DO. With the transistor T11 on, the voltage level of the voltage signal DO increases and the LPF 119 gets charged by the power supply VCC via the transistor T11. With the transistor T12 on, the voltage level of the voltage signal DO decreases and the LPF 119 discharges to ground GND via the transistor T12.

The LPF 119 operates to smooth the voltage signal DO of the charge-pump circuit 118 by removing high-frequency pulse components. As a result, the LPF 119 outputs a control voltage signal VT having no high-frequency pulse components. The VCO 120 outputs a signal FVCO whose frequency is maintained in correspondence with the value of the control voltage signal VT. The output signal FVCO is fed back to the prescaler 114 of the comparison frequency divider 113.

By the aforementioned signal feedback process, the frequency of the signal FVCO output from the VCO 120 is locked up at a multiple value of the reference signal's frequency.

To increase the tuning speed of the PLL frequency synthesizer circuit as described above, the charge-pump circuit 118 needs to relay the driving current to the LPF 119 in order that the LPF 119 can rapidly charge or discharge. To meet this requirement, when the PNP transistor T11 or the NPN transistor T12 is turned on, the charge-pump circuit 118 has to output larger driving current.

Since the PNP transistor T11 and the NPN transistor T12 are formed on one semiconductor substrate, however, the current amplification of the PNP transistor T11 is inevitably lower than that of the NPN transistor T12. This makes it difficult to improve the performance of the PNP transistor T11. In addition, generally, the current value through the bipolar transistor is constrained by the value of the current's amplification. In conventional charge pumps, therefore, the driving current of the PNP transistor T11 was constrained within a particular range, limiting the charging or discharging speed of the charge-pump circuit 118.

In order to solve the above described problem, a charge-pump circuit 121 shown in FIG. 2 has been proposed for the conventional PLL frequency synthesizer circuit. The charge-pump circuit 121 includes a PMOS transistor 122 and an NMOS transistor 123. The transistor 122 includes a source connected to the power supply VCC, a drain connected to the LPF 119, and a gate for receiving the phase difference signal $\phi R$. The transistor 123 has a source connected to the ground GND, a drain connected to the LPF 119, and a gate for receiving the phase difference signal $\phi P$.

In the charge-pump circuit 121, when the phase difference signals $\phi R$ and $\phi P$ are both held low, only the transistor 122 is turned on, whereas when the phase difference signals $\phi R$ and $\phi P$ are both held high, only the transistor 123 is turned on. When the transistor 122 is turned on, the voltage level of the voltage signal DO increases, charging the LPF 119 by the power supply VCC via the transistor 122. When the transistor 123 is turned on, the voltage level of the voltage signal DO decreases, discharging the LPF 119 to the ground GND via the transistor 123.

The magnitude of the driving current flowing through the PMOS or NMOS transistor 122 or 123 is determined based on the resistance of the transistor 122 or 123 when turned on (simply referred to as "on resistance"). Hence, the magnitude of the driving current of the transistor 122 or 123 is larger than that of the bipolar transistor T11 or T12. As a result, the charging or discharging speed of the charge-pump circuit 121 increases, which in turn, allows for the high speed tuning operation of the PLL frequency synthesizer.

If, however, there is a significant change in the on resistance of the transistor 122 or 123, the change has a great effect on the noise characteristics of the PLL frequency synthesizer circuit. Specifically, such large changes in resistance effect the time needed to acquire a lock on the frequency of the output signal FVCO. The on resistance of the transistor 122 or 123 may change quadric-functionally with respect to the change of voltage applied between the source and the drain, and increase as the applied voltage is raised. The voltage between the source and the drain of the transistor 122 or 123 tends to be proportional to the frequency of the output signal FVCO, corresponding to the channel used in the mobile communication devices. Thus, concomitant with increased changes to a channel's locked frequency are increased changes to the on resistance of the transistor 122 or 123. Consequently, the noise characteristics of a PLL frequency synthesizer and the time consumed for locking up a channel (i.e., lock-up time) depends on the change of the channel.

SUMMARY OF THE INVENTION

The present invention has been accomplished to solve the above-mentioned problems. Accordingly, it is a primary object of the present invention to provide a PLL frequency synthesizer circuit which operates to increase the charge and discharge speed of the charge-pump circuit in order to achieve high-speed tuning operation.

It is a further object of the present invention to provide a PLL frequency synthesizer circuit which increases the charge and discharge time of the charge-pump circuit through the use of MOS transistors, and which reduces the synthesizer's noise characteristics as well as the time needed to lock-up a channel.

To achieve the foregoing and other objects and in accordance with the purpose of the present invention, an improved PLL frequency synthesizer circuit is provided.

A PLL frequency synthesizer circuit according to the present invention includes a voltage controlled oscillator for generating an output signal having a variable frequency, and a comparison frequency divider for dividing a frequency of the output signal from the voltage controlled oscillator to output a comparison signal. The synthesizer circuit further includes a phase comparator and a charge-pump circuit. The phase comparator compares a phase of a reference signal to be fed thereto with a phase of the comparison signal, and generates first and second phase difference signals, based on the compared result. The charge-pump circuit is operated based on the first and second phase difference signals, and has an output terminal connected to the voltage controlled oscillator, for outputting a voltage signal. The frequency of the output signal from the voltage controlled oscillator is influenced by the voltage signal output by the charge-pump circuit.

The first type of the charge-pump circuit according to the present invention includes a first bipolar transistor connected between a high-potential power supply and the output terminal, and a second bipolar transistor connected between a low-potential power supply and the output terminal. The first and second bipolar transistors are controlled based on the first and second phase difference signals, respectively. At least one of the first and second bipolar transistors is an emitter-follower type.

The second type of the charge-pump circuit according to the present invention includes a first analog switch composed of CMOS transistors and a second analog switch composed of CMOS transistors. The first analog switch is connected between a high-potential power supply and the output terminal, and is controlled based on the first phase difference signal. The second analog switch is connected between the output terminal and a low-potential power supply, and is controlled based on the second phase difference signal.

The third type of the charge-pump circuit according to the present invention includes a plurality of PMOS transistors, connected in series between a high-potential power supply and the output terminal, and a plurality of NMOS transistors, connected in series between the output terminal and a low-potential power supply. Each of the PMOS transistors is controlled based on the first phase difference signal, while each of the NMOS transistors is controlled based on the second phase difference signal.

BRIEF DESCRIPTION OF THE DRAWINGS

The features of the present invention that are believed to be novel are set forth with particularity in the appended claims. The invention, together with objects and advantages thereof, may best be understood by reference to the following description of the presently preferred embodiments together with the accompanying drawings in which:

DETAILED DESCRIPTION OF THE PREFERRED EMBODIMENTS

First Embodiment

Figure 1:
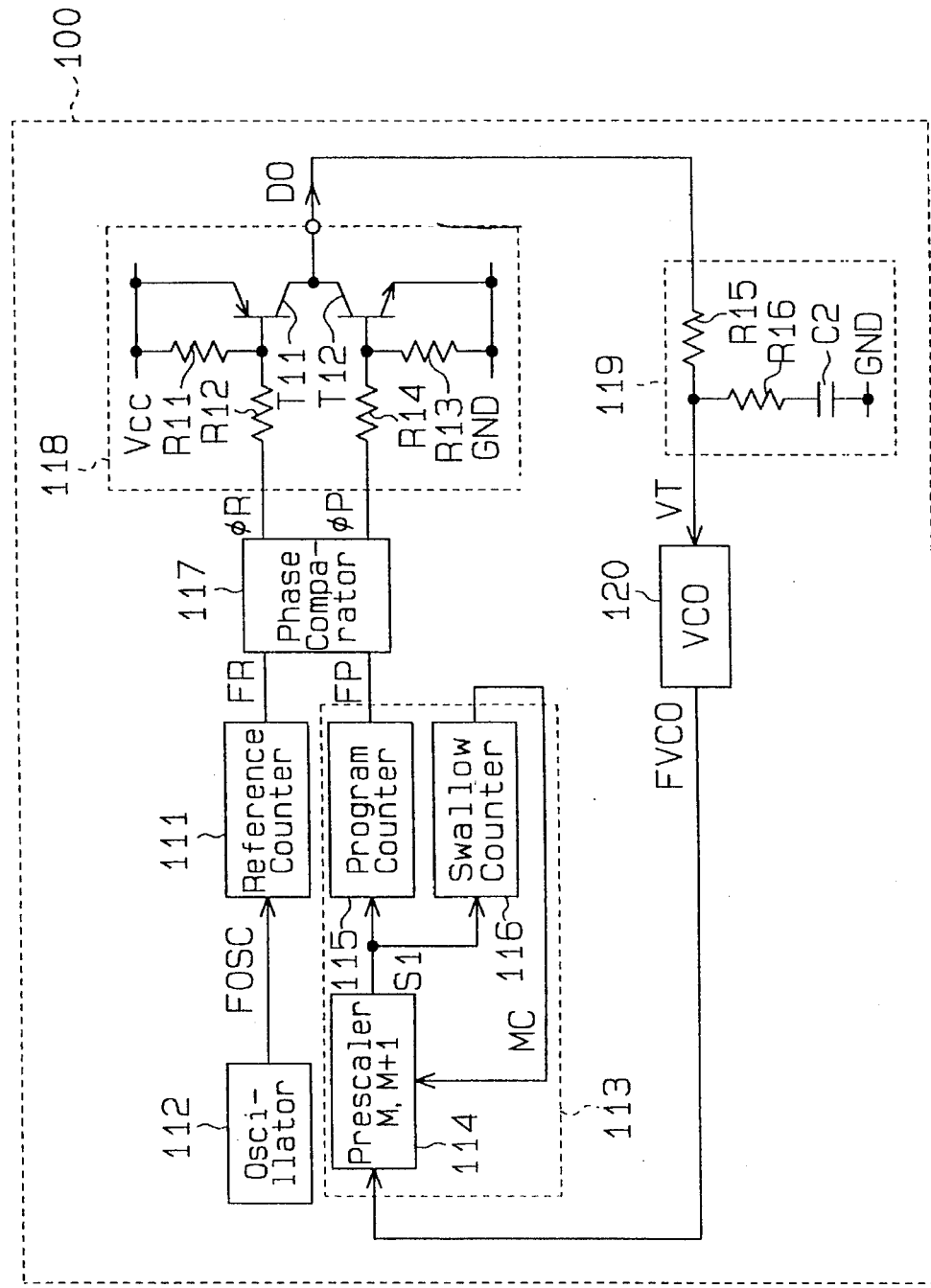
FIG. 1 is a circuit diagram showing a conventional PLL frequency synthesizer circuit.
Figure 2:
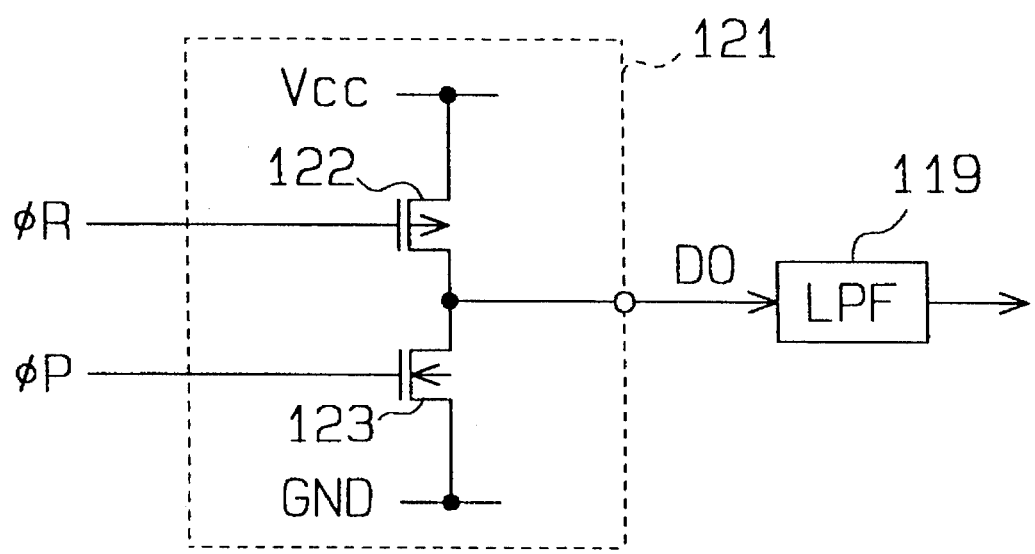
FIG. 2 is a circuit diagram showing another conventional charge-pump circuit to be incorporated in the PLL frequency synthesizer circuit as shown in FIG. 1.
Figure 3:
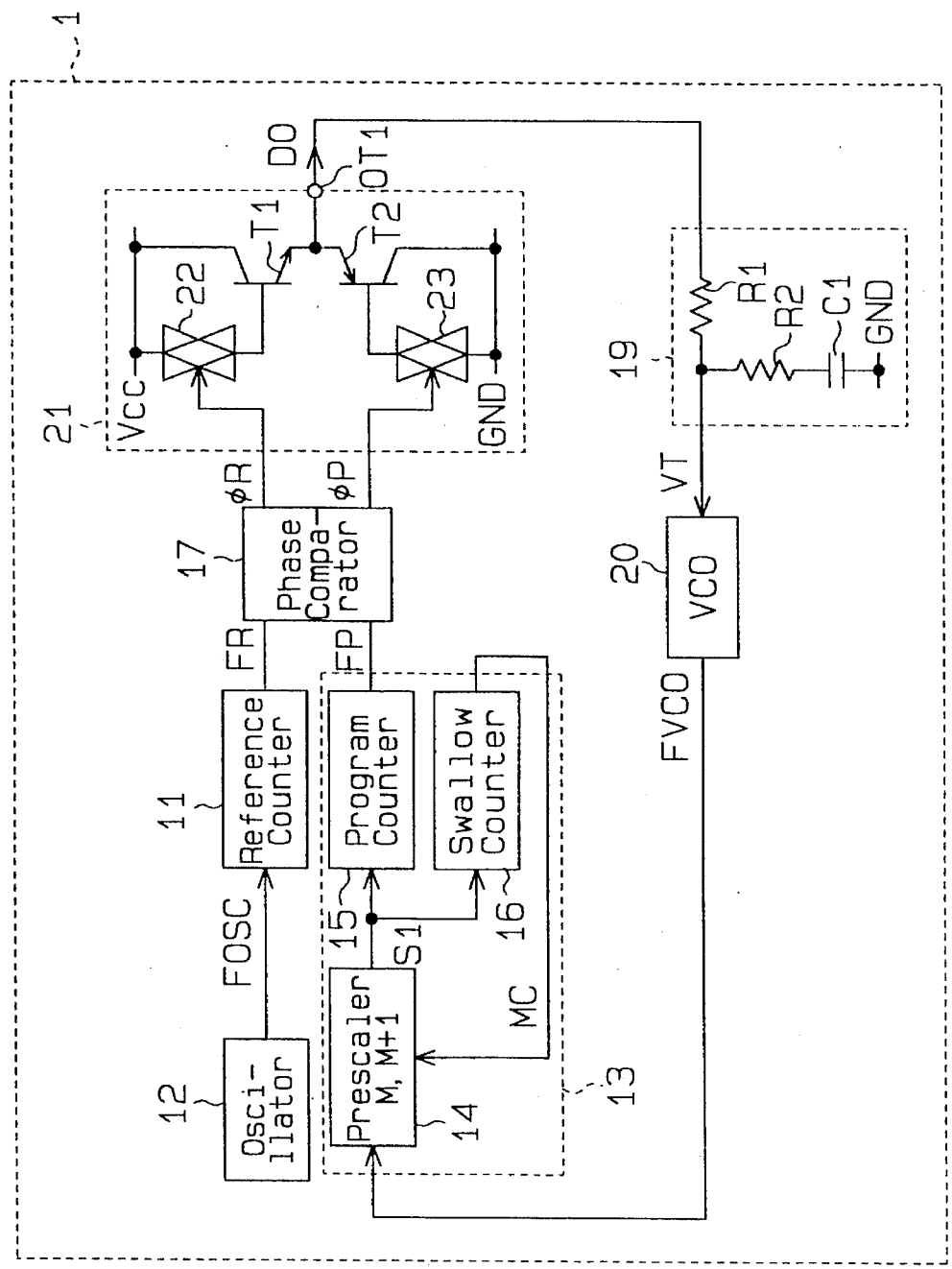
FIG. 3 is a circuit diagram showing a PLL frequency synthesizer circuit to which a charge-pump circuit according to a first embodiment of the present invention is incorporated.

A PLL frequency synthesizer circuit according to a first embodiment of the present invention will be described below with reference to FIG. 3.

A PLL frequency synthesizer circuit 1 is power-supplied by a power supply Vcc as a high-potential power supply and a ground GND as a low-potential power supply to operate on the bases of both of the power supplies Vcc and GND. The synthesizer circuit 1 includes a reference counter 11 serving as a reference frequency divider, a crystal oscillator 12, a comparison frequency divider 13, a phase comparator 17, a charge-pump circuit 21, a LPF 19 and a VCO 20. The reference counter 11, the crystal oscillator 12, the comparison frequency divider 13, the phase comparator 17, and the charge-pump circuit 21 are formed on one semiconductor substrate. The LPF 19 and the VCO 20 are externally connected to the semiconductor. The LPF 19 is composed of an integrating circuit provided with resistors R1, R2 and a capacitor C1.

The crystal oscillator 12 outputs an oscillation signal FOSC having a predetermined frequency. The reference counter 11 divides a frequency of the oscillation signal FOSC to generate a reference signal FR having a reference frequency, and outputs the reference signal FR to the phase comparator 17. Accordingly, the reference signal FR keeps its period correct.

The comparison frequency divider 13 has a prescaler 14, a program counter 15, and a swallow counter for switching a frequency-dividing ratio of the prescaler 14. The prescaler 14 divides a frequency of the signal FVCO output from the VCO 20 to generate a frequency-divided signal S1. If the frequency-dividing ratio is expressed by "M", the prescaler 14 normally divides the frequency of the output signal FVCO by a factor of (M+1). Based on a switching signal MC output from the swallow counter 16 for switching the frequency-dividing ratio, the prescaler 14 operates to divide the frequency of the output signal FVCO by a factor of M.

The program counter 15 divides the frequency of the signal S1 to generate a comparison signal FP. The program counter 15 may set the frequency of the comparison signal FP to any value. Based on the set value, the frequency of the frequency-divided signal S1 is divided. If the frequency-dividing ratio is expressed by "α", the swallow counter 16 operates to divide a frequency of the signal S1 by a factor of α. When the dividing of the frequency is completed, the swallow counter 16 operates to output the switching signal MC to the prescaler 14.

The phase comparator 17 compares the phase of the reference signal FR with that of the comparison signal FP to output the pulsewise phase difference signals φR and φP to the charge-pump circuit 21 based on the phase difference. When the phase difference signal φR is at the L level, the phase difference signal φP never goes up to the H level, whereas when the phase difference signal φP is at the H level, the phase difference signal φR never goes down to the L level.

The charge-pump circuit 21 includes an NPN transistor T1, a PNP transistor T2, and analog switches 22 and 23. The transistor T1 has a collector connected to the power supply Vcc, an emitter connected to the LPF 19, and a base connected to the power supply Vcc via the analog switch 22. The transistor T2 has a collector connected to the ground GND, an emitter connected to the LPF 19, and a base connected to the ground GND via the analog switch 23. In this embodiment, each emitter of the transistors T1 and T2 serves as an output terminal OT1. The transistor T1 or T2 functions as an emitter-follower type using the LPF 19 as the load of these transistors.

The analog switch 22 is provided between the base of the transistor T1 and the power supply Vcc. The switch 22 receives the phase difference signal φR as an input. When the phase difference signal φR is at the L level, the switch 22 is turned on to connect the base of the transistor T1 to the power supply Vcc. Then, the transistor T1 is turned on, and the charge current flows from the power supply Vcc to the LPF 19 via the transistor T1.

The analog switch 23 is provided between the base of the transistor T2 and the ground GND. The switch 23 receives the phase difference signal φP as an input. When the phase difference signal φP is at the H level, the switch 23 is turned on to connect the base of the transistor T2 to the ground GND. Then, the transistor T2 is turned on, and the discharge current flows from the LPF 19 to the ground GND via the transistor T2.

Thus, when the phase difference signals φR and φP are both at the L level, only the switch 22 is turned on so that only the associated transistor T1 is turned on. When the transistor T1 is turned on, the voltage level of the voltage signal DO is raised, and the LPF 19 is charged.

When the phase difference signals φR and φP are both at the H level, only the switch 23 is turned on so that only the associated transistor T2 is turned on. When the transistor T2 is turned on, the voltage level of the voltage signal DO is decreased, and the LPF 19 is discharged.

The LPF 19 operates to smooth the voltage signal DO from the charge-pump circuit 21, for removing the high-frequency pulse components of the signal DO. The resulting signal is a control voltage signal VT having no high-frequency pulse components. The VCO 20 outputs a signal FVCO of a frequency adjusted according to the voltage value of the control voltage signal VT. The output signal FVCO is fed back to the prescaler 14 provided in the comparison frequency divider 13.

After the aforementioned feedback process for signal treatment, the frequency of the signal FVCO output from the VCO 20 is finally locked up at a multiplication of the frequency of the reference signal FR. Hence, the frequency of the output signal FVCO, that is, the channel used in the movable communication is a multiplication of the frequency of the low-frequency reference signal FR.

As described above, the charge-pump circuit 21 of this embodiment includes the emitter-follower type NPN transistor T1 and PNP transistor T2, each using the LPF 19 as the load of these transistors. When any one of the NPN transistor T1 and the PNP transistor T2 is turned on, the output impedance of the operated transistor becomes lower. This makes it possible to enhance the charging or discharging speed of the charge pump circuit 21 thereby to increase the tuning speed of the PLL frequency synthesizer circuit 1.

Further, when the NPN transistor T1 is turned off, the base is disconnected from the power supply Vcc by the analog switch 22. Conversely, when the NPN transistor T2 is turned off, the base is disconnected from the ground GND by the analog switch 23. When the NPN and the PNP transistors T1 and T2 are both turned off, therefore, the charge-pump circuit 21 can keep a high-impedance state. As a result, if the frequency of the output signal FVCO is locked at the predetermined frequency, no variation takes place in the control voltage signal VT of the LPF 19. This makes a great contribution to keeping the frequency of the output frequency FVCO more stable.

Second Embodiment

Figure 4:
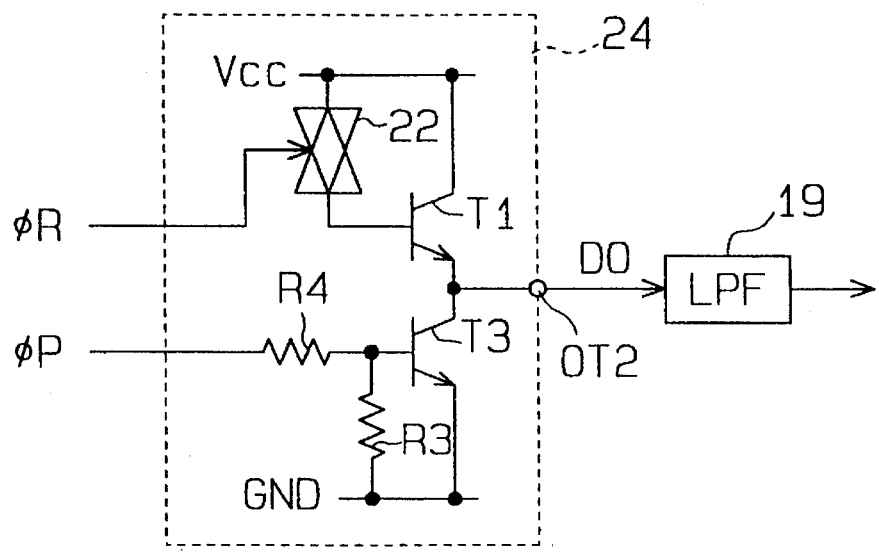
FIG. 4 is a circuit diagram showing a charge-pump circuit according to a second embodiment of the present invention.

A charge-pump circuit of the second embodiment will be described with reference to FIG. 4. The charge-pump circuit 24 according to this embodiment uses an NPN transistor T3 in place of the PNP transistor T2 located on the ground side of the charge-pump circuit 21 of the first embodiment, and uses resistors R3, R4 in place of the analog switch 23 of the first embodiment. In this embodiment, the emitter of the transistor T1 or the collector of the charge-pump circuit 24 serves as an output terminal OT2 of the charge-pump circuit 24. In this charge-pump circuit 24, when the phase difference signals $\phi R$ and $\phi P$ are both at the L level, the switch 22 is turned on and the transistor T1 is turned on so that the charge current is allowed to flow to the LPF 19. Further, when the phase difference signals $\phi R$ and $\phi P$ are both at the H level, the transistor T3 is turned on, thereby the LPF 19 allows the discharge current to flow to the ground GND via the transistor T3.

The NPN transistors T1 and T2 used in the charge-pump circuit 24 can output large driving current. Hence, the charge-pump circuit 24 increases the charging or discharging speed of the LPF 19, thus accomplishing the speed-up of the tuning operation of the PLL frequency synthesizer circuit.

The charge-pump circuit 24 of this embodiment includes the combination of the emitter-follower type transistor T1 and the analog switch 22. When the NPN transistors T1 and T3 are both turned off, the charge-pump circuit 24 keeps the impedance high.

Moreover, in the charge-pump circuit 24 of this embodiment, the NPN transistors T1 and T3, as two transistors for charging or discharging the LPF 19, are formed on one semiconductor substrate. Therefore, the characteristic variation of the transistor T1 is substantially the same as that of the transistor T3 in the manufacturing process. This makes it possible to suppress the shift of the actual characteristics of the charge-pump circuit 24 out of the desired characteristics to a minimum.

Third Embodiment

Figure 5:
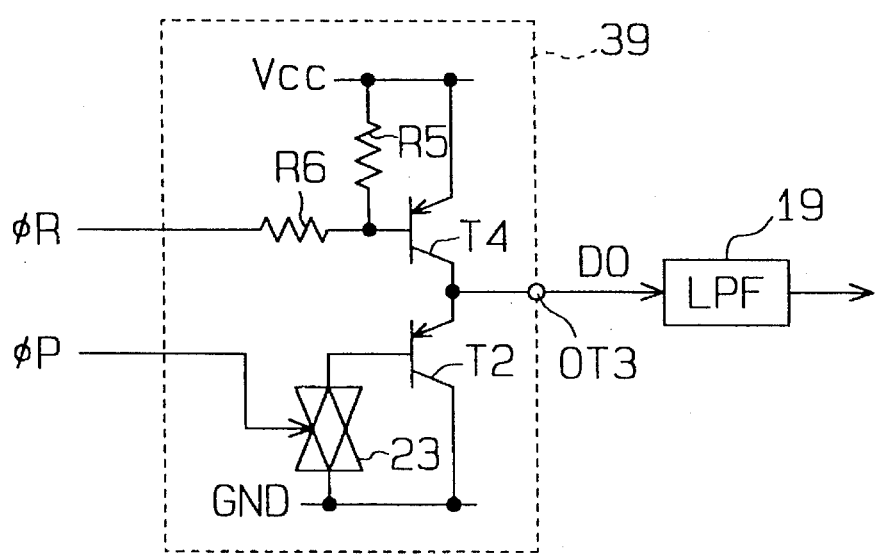
FIG. 5 is a circuit diagram showing a charge-pump circuit according to a third embodiment of the present invention.

A charge-pump circuit of the third embodiment will be described with reference to FIG. 5. The charge-pump circuit 39 uses a PNP transistor T4 in place of the NPN transistor T1 located on the side of the power supply Vcc of the charge-pump circuit 21 of the first embodiment. Moreover, the circuit 39 uses resistors R5, R6 in place of the analog switch 22 of the first embodiment. In this embodiment, a collector of the transistor T4 or an emitter of the transistor T2 serves as an output terminal OT3 of the charge-pump circuit 39. When the phase difference signals $\phi R$ and $\phi P$ are both at the L level, this charge-pump circuit 39 operates to turn the transistor T4 on, so that the charge current is allowed to flow to the LPF 19. Conversely, when the phase difference signals $\phi R$ and $\phi P$ are both at the H level, the analog switch 23 is turned on and thereby the transistor T2 is turned on to allow the discharge current to flow from the LPF 19 to the ground GND via the transistor T2.

The charge-pump circuit 39 of this embodiment is arranged to combine the emitter-follower type transistor T2 with the analog switch 23. Thus, when both of the PNP transistors T4 and T2 are turned off, the charge-pump circuit 39 keeps the impedance high.

The charge-pump circuit 39 of this embodiment uses two PNP transistors T4 and T2 for the charging or discharging operation, which transistors are formed on one semiconductor substrate. Thus, the characteristic variation of the transistor T4 is substantially the same as that of the transistor T2 in the manufacturing process. This makes it possible to suppress the shift of the actual characteristics of the charge-pump circuit 39 out of the desired characteristics to a minimum.

Fourth Embodiment

Figure 6:
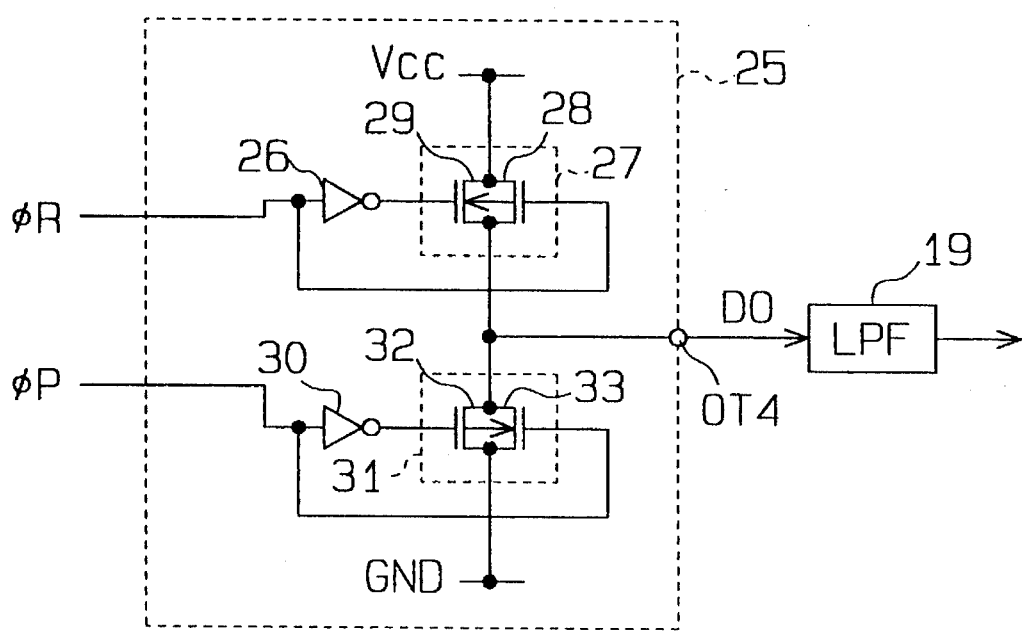
FIG. 6 is a circuit diagram showing a charge-pump circuit according to a fourth embodiment of the present invention.

A charge-pump circuit of the fourth embodiment will be described with reference to FIG. 6. The charge-pump circuit 25 of this embodiment includes two inverters 26, 30 and two analog switches 27 and 31 each composed of two CMOS transistors. The switch 27 is composed of a PMOS transistor 28 and an NMOS transistor 29. The switch 31 is composed of a PMOS transistor 32 and an NMOS transistor 33. The switches 27 and 31 are connected in series between the power supply Vcc and the ground GND. In this embodiment, a node between both of the switches 27 and 31 serves as an output terminal OT4 of the charge-pump circuit 25.

The phase difference signal $\phi R$ is input to the gate of the PMOS transistor 28 and to the gate of the NMOS transistor 29 via the inverter 26. The phase difference signal $\phi P$ is applied to the gate of the PMOS transistor 32 via the inverter 30. The same signal is also applied to the gate of the NMOS transistor 33.

Accordingly, when the phase difference signals $\phi R$ and $\phi P$ are both at the L level, only the switch 27 is turned on to raise the voltage level of the voltage signal DO. As a result, the charge current flows to the LPF 19 to charge the LPF 19. When the phase difference signals are both at the H level, only the switch 31 is turned on, so that the voltage level of the voltage signal DO decreases. As a result, the discharge current flows from the LPF 19 to the ground GND to discharge the LPF 19.

In the charge-pump circuit 25 of this embodiment, the analog switches 27 and 31, each composed of CMOS transistors, operate to charge or discharge the LPF 19. The driving current flowing through the switch 27 is defined by the on resistances given when the transistors 28 and 29 are turned on. The driving current flowing through the switch 31 is defined by the on resistances of the transistors 32 and 33. Therefore, the driving currents given by the transistors 28, 29, 32, 33 are larger than those given by the bipolar transistors. This makes it possible to speed up the charging and discharging operation of the charge-pump circuit 25, thereby achieving the high-speed tuning of the PLL frequency synthesizer circuit.

The on resistance of each of the MOS transistors 28, 29, 32 and 33 is greatly changed according to a great change of a channel to be locked (i.e., frequency of the output signal FVCO). The switch 27 or 31 includes the PMOS and the NMOS transistors connected in parallel, so that the on resistance of the switch 27 or 31 is smaller than that of each transistor and varies less. This makes a contribution to suppressing dependence of the noise characteristics and the lock-up time on a channel in the PLL frequency synthesizer circuit.

Fifth Embodiment

A charge-pump circuit according to the fifth embodiment of the invention will be described below with reference to FIG. 7. The charge-pump circuit 34 of this embodiment includes two PMOS transistors 35 and 36 and two NMOS transistors 37 and 38, which are connected in series between the power supply Vcc and the ground GND. In this embodiment, a node between the transistors 36 and 37 serves as an output terminal OT5 of the charge-pump circuit 34.

The phase difference signal φR is input to each gate of the PMOS transistors 35 and 36, while the phase difference signal φP is input to each gate of the NMOS transistors 37 and 38. When the phase difference signals φR and φP are both at the L level, only the transistors 35 and 36 are turned on to raise the voltage level of the voltage signal DO. This allows the charge current to flow to the LPF 19 for charging the LPF 19. When the phase difference signals φR and φP are both at the H level, only the transistors 37 and 38 are turned on to lower the voltage level of the voltage signal DO. This allows the discharge current to flow from the LPF 19 to the ground GND via the NMOS transistors 37 and 38 for discharging the LPF 19.

The charge-pump circuit 34 of this embodiment is arranged so that the PMOS transistors 35 and 36 operate to charge the LPF 19 and the NMOS transistors 37 and 38 operate to discharge the LPF 19. Therefore, the driving current of the charge-pump circuit 34 is larger than that of the circuit arranged to have the bipolar transistors. This makes it possible to speed up the charging or the discharging operation of the charge-pump circuit 34, thereby achieving the quick tuning of the PLL frequency synthesizer circuit.

In the case where the LPF 19 is charged if the PMOS transistors 35 and 36 are turned on, the difference voltage between the power supply Vcc and the voltage signal DO is divided by both of the transistors 35 and 36 so that the divided voltage is applied between the source and the drain of each transistor 35 or 36. In the case where the LPF 19 is discharged if the NMOS transistors 37 and 38 are turned on, the difference voltage between the voltage signal DO and the ground GND is divided by both of the transistors 37 and 38 so that the divided voltage is applied between the source and the drain of each transistor 37 or 38. This makes the on-resistance variation of each of the MOS transistors 35, 36, 37 and 38 smaller. Thus, dependence of the noise characteristics and the lock-up time on a channel can be suppressed in the PLL frequency synthesizer circuit.

Although several embodiments of the present invention have been described herein, it should be apparent to those skilled in the art that the present invention may be embodied in many other forms without departing from the spirit or the scope of the invention. Particularly, it should be understood that the following modification may be employed.

Figure 7:
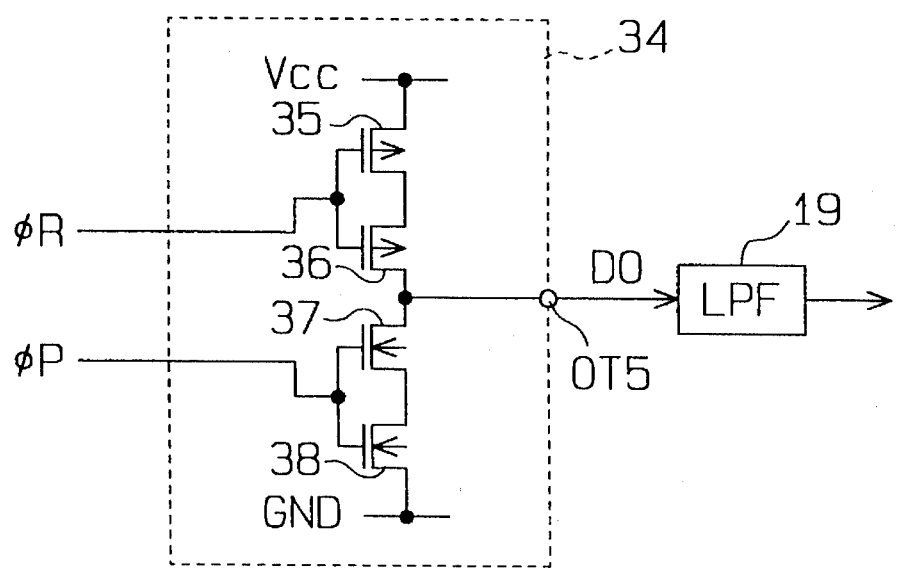
FIG. 7 is a circuit diagram showing a charge-pump circuit according to a fifth embodiment of the present invention.

The charge-pump circuit 34 shown in FIG. 7 may employ three or more of the PMOS transistors and the NMOS transistors to be connected in series.

Therefore, the present examples and embodiments are to be considered as illustrative and not restrictive, and the invention is not to be limited to the details given herein.

What is claimed is:

1. A PLL frequency synthesizer circuit comprising:

a voltage controlled oscillator for generating an output signal having a variable frequency;

a comparison frequency divider for dividing a frequency of said output signal from said voltage controlled oscillator to output a comparison signal;

a phase comparator for comparing a phase of a reference signal to be fed thereto with a phase of said comparison signal and for generating a first phase difference signal and a second phase difference signal based on the compared result; and a charge-pump circuit to be operated based on said first and second phase difference signals and having an output terminal for outputting a voltage signal, said output terminal being connected to said voltage controlled oscillator, the frequency of said output signal being influenced by the voltage signal, wherein said charge-pump circuit includes:

a first bipolar transistor, connected between a high-potential power supply and said output terminal, to be controlled based on said first phase difference signal;

a second bipolar transistor, connected between a low-potential power supply and said output terminal, to be controlled based on said second phase difference signal; and both of said first and second bipolar transistors being emitter-follower types;

wherein said first bipolar transistor is an NPN transistor having a collector connected to said high-potential power supply and an emitter connected to said output terminal; and wherein said second bipolar transistor is a PNP transistor having a collector connected to said low-potential power supply and an emitter connected to said output terminal.

2. The PLL frequency synthesizer circuit according to claim 1 further comprising a reference counter for dividing a reference frequency of an oscillation signal having a predetermined frequency to generate said reference signal.

3. The PLL frequency synthesizer circuit according to claim 1 further comprising a low-pass filter, provided between said charge-pump circuit and said voltage controlled oscillator, for smoothing said voltage signal to generate a control voltage signal.

4. A charge-pump circuit for use in a PLL frequency synthesizer circuit, the charge-pump circuit being operated based on first and second phase difference signals to be fed thereto, comprising:

an output terminal for outputting a voltage signal;

a first bipolar transistor, connected between a high-potential power supply and said output terminal, to be controlled based on the first phase difference signal;

a second bipolar transistor, connected between a low-potential power supply and said output terminal, to be controlled based on the second phase difference signal; and both of said first and second bipolar transistors being emitter-follower types;

wherein said first bipolar transistor is an NPN transistor having a collector connected to said high-potential power supply and an emitter connected to said output terminal; and wherein said second bipolar transistor is a PNP transistor having a collector connected to said low-potential power supply and an emitter connected to said output terminal.

5. A PLL frequency synthesizer circuit comprising:

a voltage controlled oscillator for generating an output signal having a variable frequency;

a comparison frequency divider for dividing a frequency of said output signal from said voltage controlled oscillator to output a comparison signal;

a phase comparator for comparing a phase of a reference signal to be fed thereto with a phase of said comparison signal, and for generating a first phase difference signal and a second phase difference signal based on the compared result; and a charge-pump circuit to be operated based on said first and second phase difference signals and having an output terminal for outputting a voltage signal, said output terminal being connected to said voltage controlled oscillator, the frequency of said output signal being influenced by said voltage signal, wherein said charge-pump circuit includes:

a first analog switch connected between a high-potential power supply and said output terminal, said first analog switch being controlled based on said first phase difference signal, said first analog switch being composed of a pair of PMOS and NMOS transistors connected in parallel; and a second analog switch connected between said output terminal and a low-potential power supply, said second analog switch being controlled based on said second phase difference signal., said second analog switch being composed of a pair of PMOS and NMOS transistors connected in parallel.

6. A charge-pump circuit for use in a PLL frequency synthesizer circuit, the charge-pump circuit being operated based on first and second phase difference signals to be fed thereto, comprising:

an output terminal for outputting a voltage signal;

a first analog switch connected between a high-potential power supply and said output terminal, said first analog switch being controlled based on the first phase difference signal, said first analog switch being composed of a pair of PMOS and NMOS transistors connected in parallel; and a second analog switch connected between said output terminal and a low-potential power supply, said second analog switch being controlled based on the second phase difference signal, said second analog switch being composed of a pair of PMOS and NMOS transistors connected in parallel.

\* \* \* \* \*